US012656508B2

(12) United States Patent
Yun et al.

(10) Patent No.:  US 12,656,508 B2
(45) Date of Patent:  Jun. 16, 2026

(54) X-RAY DETECTOR

(71) Applicants: RAYENCE Co., Ltd., Gyeonggi-do (KR); VATECH EWOO Holdings Co., Ltd., Gyeonggi-do (KR); Qpix solutions Inc., Morrisville, NC (US)

(72) Inventors: Seungman Yun, Morrisville, NC (US); Jinwoong Jeong, Gyeonggi-do (KR); Hoseok Lee, Gyeonggi-do (KR)

(73) Assignees: RAYENCE Co., Ltd., Gyeonggi-do (KR); VATECH EWOO Holdings Co., Ltd., Gyeonggi-do (KR); Qpix solutions Inc., Morrisville, NC (US)

( * ) Notice: Subject to any disclaimer, the term of this patent is extended or adjusted under 35 U.S.C. 154(b) by 125 days.

(21) Appl. No.: 18/914,022

(22) Filed: Oct. 11, 2024

(65) Prior Publication Data

US 2025/0123413 A1      Apr. 17, 2025

Related U.S. Application Data

(60) Provisional application No. 63/590,098, filed on Oct. 13, 2023.

(51) Int. Cl.
| | |
|---|---|
| *G01T 1/24* | (2006.01) |
| *H10F 30/00* | (2025.01) |
| *H10F 77/169* | (2025.01) |
| *H10F 77/20* | (2025.01) |
| *H10F 77/50* | (2025.01) |

(52) U.S. Cl.
CPC ........... *G01T 1/241* (2013.01); *H10F 30/301* (2025.01); *H10F 77/169* (2025.01); *H10F 77/20* (2025.01); *H10F 77/50* (2025.01)

(58) Field of Classification Search
CPC ..................................................... G01T 1/241
See application file for complete search history.

(56) References Cited

U.S. PATENT DOCUMENTS

| | | | | |
|---|---|---|---|---|
| 6,225,632 | B1 | 5/2001 | Kinno et al. | |
| 8,816,294 | B2 * | 8/2014 | Lee .......................... | G01T 1/241 |
| | | | | 250/370.08 |
| 2012/0153174 | A1 | 6/2012 | Tredwell | |
| 2013/0168555 | A1 | 7/2013 | Moon | |
| 2018/0240848 | A1 | 8/2018 | Heo et al. | |
| 2018/0277608 | A1 * | 9/2018 | Lifka ......................... | G01T 1/24 |
| 2021/0356608 | A1 * | 11/2021 | Jacobs ...................... | G01T 1/24 |
| 2022/0165900 | A1 * | 5/2022 | Meng ....................... | A61B 6/56 |

(Continued)

FOREIGN PATENT DOCUMENTS

| | | |
|---|---|---|
| JP | 11-68078 A | 3/1999 |
| KR | 10-2013-0077127 A | 7/2013 |

(Continued)

*Primary Examiner* — Edwin C Gunberg
(74) *Attorney, Agent, or Firm* — IP Legal Services, LLC

(57) ABSTRACT

Proposed is an X-ray detector including a substrate with a defined display area and a non-display area around the display area, a first electrode provided in the display area on the substrate, a photoconductor layer located on the first electrode and provided in the display area and the non-display area, a second electrode provided on the photoconductor layer, and at least one contact pattern provided in the non-display area and configured to surround the display area, wherein the photoconductor layer is in contact with the at least one contact pattern located therebelow.

8 Claims, 6 Drawing Sheets

(56)     References Cited

U.S. PATENT DOCUMENTS

| 2022/0291401 | A1* | 9/2022 | Shirley | H10F 39/189 |
| 2023/0165541 | A1* | 6/2023 | Xu | A61B 6/032 |
| | | | | 250/309 |

FOREIGN PATENT DOCUMENTS

| KR | 10-2017-0029371 | A | | 3/2017 | |
| WO | WO-9726677 | A1 | * | 7/1997 | H10F 39/811 |

* cited by examiner

NA        MP        OP2        10        100

10

AA

NA    MP(OP2)    MP(OP2)    10

100

10

X-RAY DETECTOR

CROSS REFERENCE TO RELATED APPLICATION

This application claims the benefit of the filing date of U.S. Patent Provisional Application No. 63/590,098, filed Oct. 13, 2023, the teaches of which are incorporated herein their entirety by reference.

BACKGROUND

Technical Field

The present disclosure relates to an X-ray detector.

Description of the Related Art

In recent years, digital detectors have become widely used for X-ray imaging.

X-ray detectors are divided into indirect-conversion and direct-conversion types. Indirect-conversion detectors have a scintillator that first converts X-rays into visible light, and then the visible light is converted to electrical signals. In direct conversion, on the other hand, a photoconductor that absorbs X-rays and directly creates electrical signals is used.

However, there is a difference in thermal expansion coefficient between a photoconductor layer and a substrate, causing the problem of the photoconductor layer being detached (or peeled) due to temperature changes.

SUMMARY

Accordingly, the present disclosure has been made keeping in mind the above problems occurring in the related art, and the present disclosure is intended to provide a method to prevent a photoconductor layer from detaching from a substrate.

In order to achieve the above objective, according to an aspect of the present disclosure, there is provided an X-ray detector including: a substrate with a defined display area and a non-display area around the display area; a first electrode provided in the display area on the substrate; a photoconductor layer located on the first electrode and provided in the display area and the non-display area; a second electrode provided on the photoconductor layer; and at least one contact pattern provided in the non-display area and configured to surround the display area, wherein the photoconductor layer may be in contact with the at least one contact pattern located therebelow.

The X-ray detector may further include an interlayer insulating layer provided on the first electrode and the at least one contact pattern, wherein the interlayer insulating layer may include: a first opening where the photoconductor layer contacts the first electrode; and a second opening where the photoconductor layer contacts the at least one contact pattern.

The X-ray detector may further include a protective layer provided on the interlayer insulating layer, wherein the interlayer insulating layer and the protective layer may include: the first opening where the photoconductor layer contacts the first electrode; and the second opening where the photoconductor layer contacts the at least one contact pattern.

The at least one contact pattern and the first electrode may be made of the same metal or oxide.

The metal may be titanium (Ti), tungsten (W), aluminum (Al), copper (Cu), chromium (Cr), gold (Au), or an alloy of any one of these, and the oxide may be ITO (indium tin oxide), IZO (indium zinc oxide), or ZnO (zinc oxide).

The X-ray detector may further include a sealing member configured to contact with an outer surface of the substrate and an outer surface of the photoconductor layer.

The outer surface of the substrate may be located inward than the outer surface of the photoconductor layer, and the sealing member may be located on an upper surface of an end of the substrate and may contact the outer surface of the photoconductor layer.

The photoconductor layer may be made of perovskite.

According to the present disclosure, by forming at least one contact pattern along a non-display area, a photoconductor layer can be in close contact with a substrate not only in a display area but also in the non-display area.

Accordingly, it is possible to increase a contact area between the photoconductor layer on the substrate and a material with excellent adhesion characteristics thereto. Therefore, the adhesion of the photoconductor layer to the substrate can be increased, thereby alleviating the problem of detachment (or peeling) of the photoconductor layer from the substrate.

Furthermore, a sealing member that contacts and seals the photoconductor layer and substrate can be formed on the side of an X-ray detector of the present disclosure. As a result, the adhesion of the photoconductor layer to the substrate can be further increased, making it possible to alleviate the problem of the photoconductor layer being detached (or peeled) from the substrate.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION

Hereinafter, embodiments of the present disclosure will be described in detail with reference to the drawings.

First Embodiment

Figure 1:
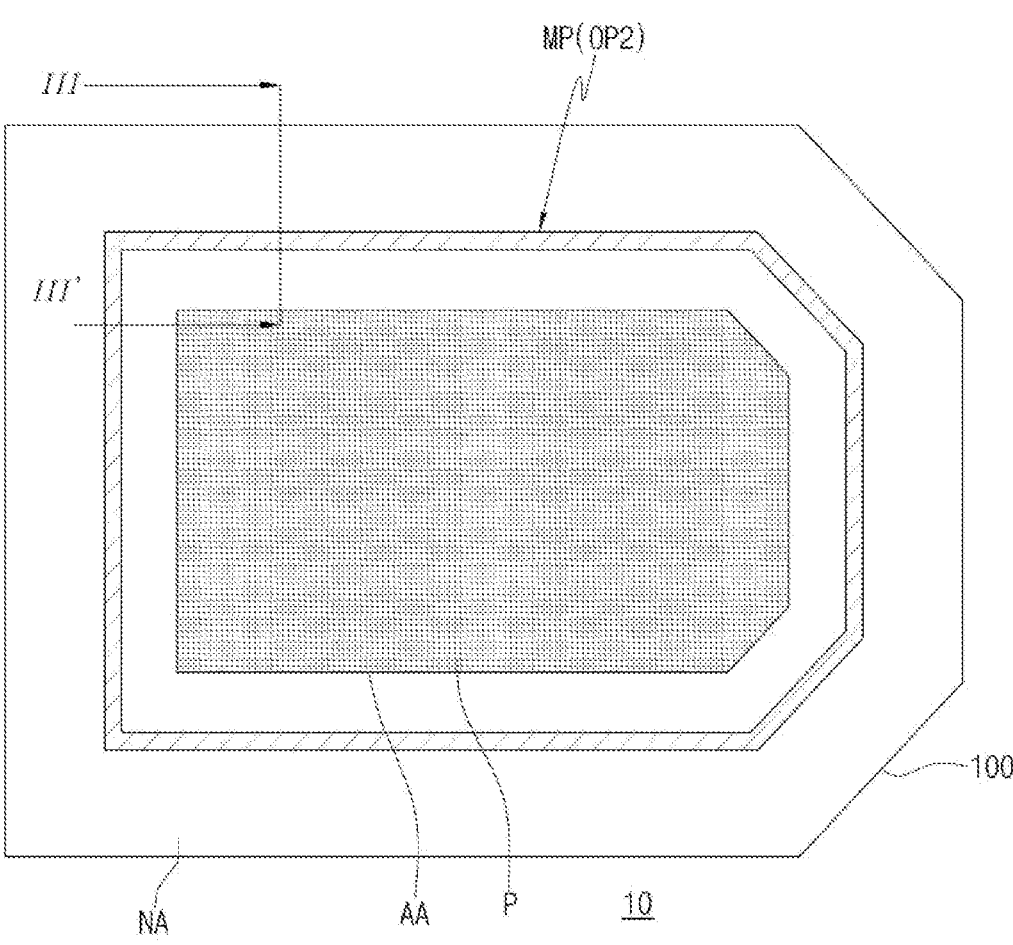
FIG. 1 is a plan view schematically showing an X-ray detector according to a first embodiment of the present disclosure.
Figure 2:
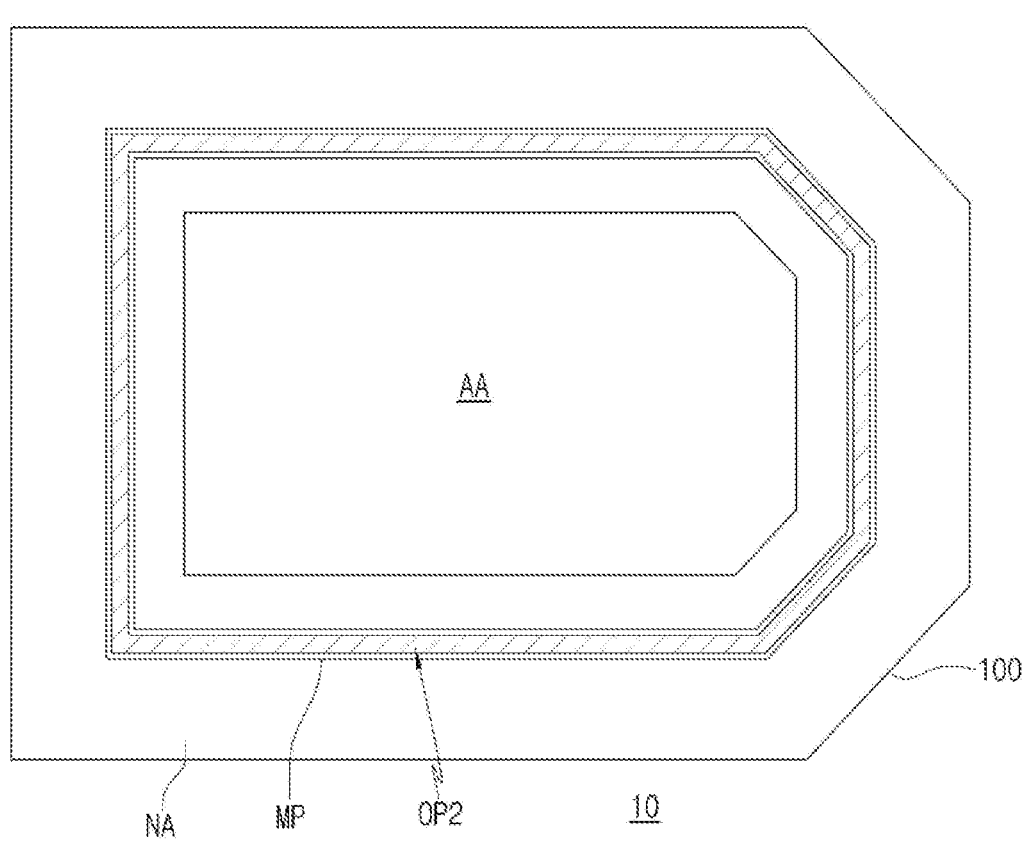
FIG. 2 is a plan view schematically showing a contact pattern of the X-ray detector according to the first embodiment of the present disclosure and a second opening exposing the contact pattern.
Figure 3:
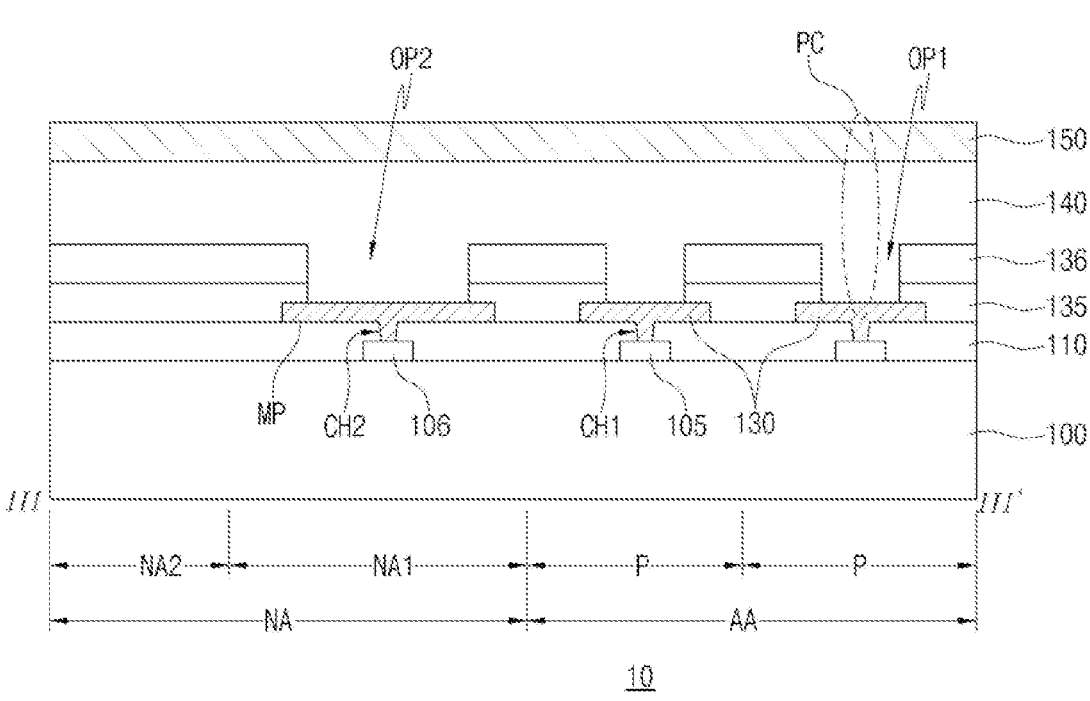
FIG. 3 is a cross-sectional view taken along the cutting line III-III' in FIG. 1.

FIG. 1 is a plan view schematically showing an X-ray detector according to a first embodiment of the present disclosure. FIG. 2 is a plan view schematically showing a contact pattern of the X-ray detector according to the first embodiment of the present disclosure and a second opening exposing the contact pattern. FIG. 3 is a cross-sectional view taken along the cutting line III-III' in FIG. 1.

Referring to FIGS. 1 to 3, an X-ray detector 10 according to a first embodiment of the present disclosure corresponds to a direct-conversion X-ray detector provided with a photoconductor layer 140.

The X-ray detector 10 may include a display area (active area) AA, which is the area that actually receives and detects X-rays, and a non-display area (non-active area) NA located outside the display area AA.

In the display area AA, a pixel array composed of a plurality of pixels P is disposed on a substrate 100, and the pixels P may be arranged in a matrix form along a plurality of row lines and a plurality of column lines.

Meanwhile, although not specifically shown, on the substrate 100, a plurality of scan lines (or gate lines) extending along the row lines and a plurality of signal transmission lines (or data lines) extending along the column lines may be disposed. The scan lines and the signal transmission lines may be connected to corresponding pixels P.

Meanwhile, in the embodiment, the substrate 100 may be composed of, but is not limited to, a CMOS substrate, a glass substrate, or a plastic substrate having flexible properties. In this embodiment, the case where a CMOS substrate is used as the substrate 100 is taken as an example.

A photoconductive element PC that detects X-rays and generates a corresponding electrical signal may be provided on the substrate 100 in each pixel P disposed in the display area AA.

In this regard, the photoconductive element PC may include: a first electrode (or pixel electrode) 130, which is a lower electrode provided on the substrate 100; a second electrode (or common electrode) 150, which is an upper electrode located above the first electrode 130; and the photoconductor layer 140 interposed between the first electrode 130 and the second electrode 150.

The first electrode 130 may be provided in a patterned form on a pixel-by-pixel basis corresponding to each pixel P. The first electrode 130 may be formed of, for example, a highly conductive metal. In this regard, the first electrode 130 may be made of titanium (Ti), tungsten (W), aluminum (Al), copper (Cu), chromium (Cr), gold (Au), or an alloy of any one of these, but is limited thereto. Alternatively, the first electrode 130 may be made of oxides such as ITO (indium tin oxide), IZO (indium zinc oxide), and ZnO (zinc oxide), but is limited thereto.

Meanwhile, below the first electrode 130 (that is, between the first electrode 130 and the substrate 100), a connection electrode (or intermediate electrode) 105 and a first interlayer insulating layer 110 may be provided.

The connection electrode 105 is provided within each pixel P and may electrically connect a transistor (not shown) and the photoconductive element PC within each pixel P. The connection electrode 105 may be made of metal.

The first interlayer insulating layer 110 may be provided on the connection electrode 105. The first interlayer insulating layer 110 may be provided in the display area AA and the non-display area NA. The first interlayer insulating layer 110 may be made of an inorganic insulation material or an organic insulation material.

A first contact hole CH1 exposing the connection electrode 105 may be formed in the first interlayer insulating layer 110. Through the first contact hole CH1, the first electrode 130 may be connected to the connection electrode 105.

A second interlayer insulating layer 135 may be provided on the first electrode 130 along the boundary of each pixel P and may cover the edge of the first electrode 130. The second interlayer insulating layer 135 may have a first opening OP1 exposing the first electrode 130.

The second interlayer insulating layer 135 may be provided in the display area AA and the non-display area NA. The second interlayer insulating layer 135 may be made of an inorganic insulation material or an organic insulation material.

A protective layer 136 may be provided on the second interlayer insulating layer 135. Similar to the second interlayer insulating layer 135, the protective layer 136 may be provided, for example, along the boundary of each pixel P and may cover the edge of the first electrode 130. The protective layer 136 may have a first opening OP1 that exposes the first electrode 130 together with the second interlayer insulating layer 135.

The photoconductor layer 140 may be formed on the substrate 100 on which the protective layer 136 is formed. The photoconductor layer 140 may contact the first electrode 130 exposed through the first opening OP1.

The photoconductor layer 140 may be provided continuously along the pixels P substantially arranged in the display area AA. In addition, the photoconductor layer 140 may be provided in the non-display area NA. In other words, the photoconductor layer 140 may be provided substantially over the entire surface of the substrate 100.

As a photoconductor forming the photoconductor layer 140, perovskite may be used.

The perovskite is a material with a crystal structure following the formula ABX3, where A denotes a monovalent cation, B denotes a metal cation, and X may denote a halogen anion.

The perovskite may be, but is not limited to, CsPbBr3, Cs2AgBiBr6, MAPbI3, or MAPbBr3.

Meanwhile, the photoconductor layer 140 of perovskite may be formed, for example, by a solution method. The photoconductor layer 140 of perovskite may be formed through a process of applying and curing a solution (or paste) containing a perovskite powder and a solvent onto the substrate 100 on which the first electrode 130 is provided.

The second electrode 150 may be provided on the photoconductor layer 140. The second electrode 150 may be provided in the display area AA and the non-display area NA. A bias voltage may be applied to the second electrode 150.

Meanwhile, in this embodiment, a contact pattern MP in contact with the photoconductor layer 140 may be created in the non-display area NA.

In this regard, the photoconductor layer 140 has poor adhesion characteristics with insulation materials, but has good adhesion characteristics with metals or oxides. Considering the adhesion characteristics of the photoconductor material layer 140, in this embodiment, by creating the contact pattern MP in contact with the photoconductor layer in the non-display area NA, the area of a metal or an oxide in contact with the photoconductor layer 140 is increased, thereby increasing the adhesion of the photoconductor layer 140 to the substrate 100. As a result, it is possible to alleviate the problem of the photoconductor layer 140 being detached (or peeled) from the substrate 100.

In this way, the contact pattern MP for improving the adhesion of the photoconductor layer 140 may be created in a ring shape surrounding the display area AA.

In this regard, the non-display area NA may include: a second area NA2, which is the outermost edge area; and a first area NA1 located between the second area NA2 and the display area AA and surrounding the display area AA.

At this time, the contact pattern MP may be created in the first area NA1. The contact pattern MP may be created in the same process as that of the first electrode 130. In other words, the contact pattern MP may be made of the same material and formed on the same layer as the first electrode 130.

In this regard, as previously mentioned, the first electrode 130 is made of a highly conductive metal or oxide, and thus has excellent adhesion characteristics to the photoconductor layer 140. As such, by creating the contact pattern MP with a highly conductive metal or oxide, the adhesion of the photoconductor layer 140 may be improved.

Meanwhile, an auxiliary pattern 106 and the first interlayer insulating layer 110 may be disposed below the contact pattern MP.

The auxiliary pattern 106 may be created in the first area NA1 and may contact with the contact pattern MP. The auxiliary pattern 106 may be created, for example, in the same process as that of the connection electrode 105 in the display area AA, and may be formed on the same layer and made of the same material as the connection electrode 105.

The first interlayer insulating layer 110 may be provided with a second contact hole CH2. Through the second contact hole CH2, the contact pattern MP may contact and be connected to the auxiliary pattern 106.

The auxiliary pattern 106 may receive, for example, a pixel reset voltage (or ground voltage) applied to the pixels P. Accordingly, the pixel reset voltage (or ground voltage) may be applied to the contact pattern MP.

In this way, when a constant voltage is configured to be applied to the contact pattern MP, the contact pattern MP may function as a discharge element, etc., and may play a role in protecting the display area AA from static electricity, etc.

On the contact pattern MP, the second interlayer insulating layer 135 and the protective layer 136 are disposed, and the second interlayer insulating layer 135 and the protective layer 136 may cover both sides (i.e., inner and outer) edges of the contact pattern MP. The second interlayer insulating layer 135 and the protective layer 136 may have a second opening OP2 exposing the contact pattern MP.

The second opening OP2 may be formed in a ring shape surrounding the display area AA in a planar manner similar to the contact pattern MP.

In this regard, the second opening OP2 may be formed, for example, as a closed loop structure that is continuously connected throughout, or may be formed as a structure that is broken (interrupted) at least one or more points. In this embodiment, for convenience of explanation, an example is taken where the second opening OP2 is formed in a continuous closed loop structure as shown in FIGS. 1 and 2. Meanwhile, as an example related to the case where the second opening OP2 is formed in a broken structure, the second opening OP2 may be composed of a first part corresponding to one side of the display area AA and a second part corresponding to the remaining sides of the display area AA. The first part and the second part may be separated from each other, and the overall shape of the first and second parts may have a ring shape substantially corresponding to the contact pattern MP.

The photoconductor layer 140 provided in the non-display area NA may be located on the second opening OP2 and the contact pattern MP exposed through the second opening OP2. The portion of the photoconductor layer 140 disposed in the non-display area NA may contact the contact pattern MP through the second opening OP2.

In this way, by creating the contact pattern MP in the non-display area NA, the photoconductor layer 140 may contact the metal or oxide in the non-display area NA in addition to the display area AA. Accordingly, it is possible to increase the contact area between the photoconductor layer 140 and the metal or oxide having excellent adhesion characteristics thereto on the substrate 100.

In addition, the second opening OP2 allows the surface of the substrate 100 in the non-display area NA to have a substantially uneven shape, and along this uneven surface, the photoconductor layer 140 may be isotropically stacked and closely adhered through a solution method, etc. As such, the surface area of the substrate 100 to which the photoconductor layer 140 is in close contact is increased by the uneven shape, and thus the close contact area between the photoconductor layer 140 and the substrate 100 may be increased.

As a result, since the adhesion of the photoconductor layer 140 to the substrate 100 may be increased, the problem of the photoconductor layer 140 being detached (or peeled) from the substrate 100 may be alleviated.

Meanwhile, in the non-display area NA, the second electrode 150 may be provided on the photoconductor layer 140.

As previously mentioned, according to this embodiment, by creating the contact pattern MP in the non-display area NA, the photoconductor layer 140 may contact the metal or oxide not only in the display area AA but also in the non-display area NA.

Accordingly, it is possible to increase the contact area between the photoconductor layer 140 and the metal or oxide having excellent adhesion characteristics thereto on the substrate 100. As a result, the adhesion of the photoconductor layer 140 to the substrate 100 may be increased, thereby alleviating the problem of the photoconductor layer 140 being detached (or peeled) from the substrate 100.

In addition, since the contact pattern MP may be created in the same process as that of the first electrode 130, there is no need to perform a separate mask process to create the contact pattern MP, thereby ensuring process efficiency.

Second Embodiment

Figure 4:
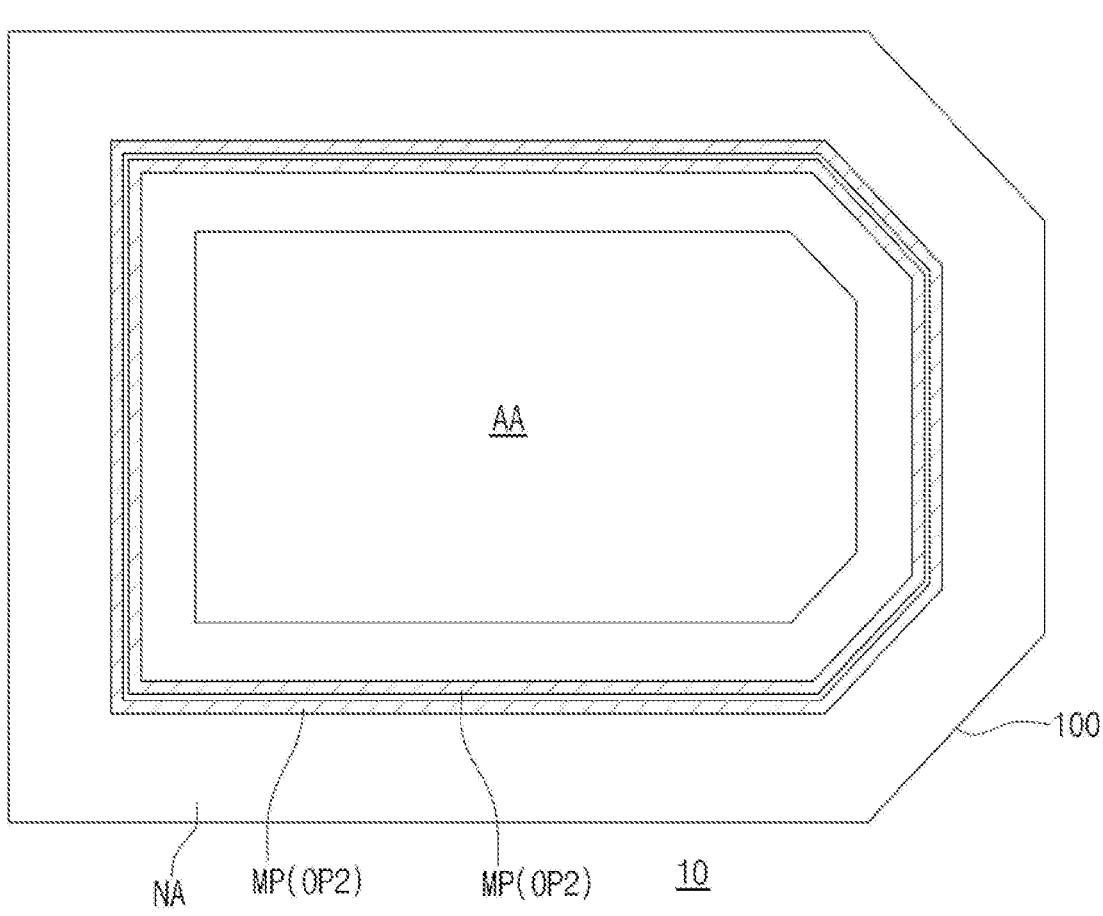
FIG. 4 is a plan view schematically showing an X-ray detector according to a second embodiment of the present disclosure.

FIG. 4 is a plan view schematically showing an X-ray detector according to a second embodiment of the present disclosure.

In this embodiment, detailed description of the same and similar configuration as the above-described first embodiment may be omitted.

An X-ray detector 10 according to the second embodiment may have the same or similar configuration as the X-ray detector of the first embodiment described above.

Meanwhile, in this embodiment, a plurality of contact patterns MP may be created in the non-display area NA. In this embodiment, for convenience of explanation, a case in which two contact patterns MP are provided is taken as an example.

Each of the contact patterns MP created in the non-display area NA may be formed in a ring shape and may be arranged to be spaced apart from each other along the outer direction (or along the inner direction). That is, among the contact patterns MP, the contact pattern MP located relatively on the outside may be arranged to surround the contact pattern MP located on the relatively inside.

In addition, a plurality of second openings OP2 may be provided to expose each of the contact patterns MP. Each of the second openings OP may be formed in the protective layer (136 in FIG. 3) and the second interlayer insulating layer (135 in FIG. 3).

At this time, each of the second openings OP2 may be formed as an entirely continuous structure, or may be formed as a structure broken (interrupted) at least one or more points.

In this way, by forming the plurality of contact patterns MP and the plurality of second openings OP2, the contact area between the photoconductor layer (140 in FIG. 3) and the metal or oxide may be increased. In addition, by providing the plurality of second openings OP2, the uneven surface increases and the contact area between the photoconductor layer and the substrate 100 may be further increased.

As a result, the adhesion of the photoconductor layer 140 to the substrate 100 may be further increased, thereby alleviating the problem of the photoconductor layer 140 being detached (or peeled) from the substrate 100.

Third Embodiment

Figure 5:
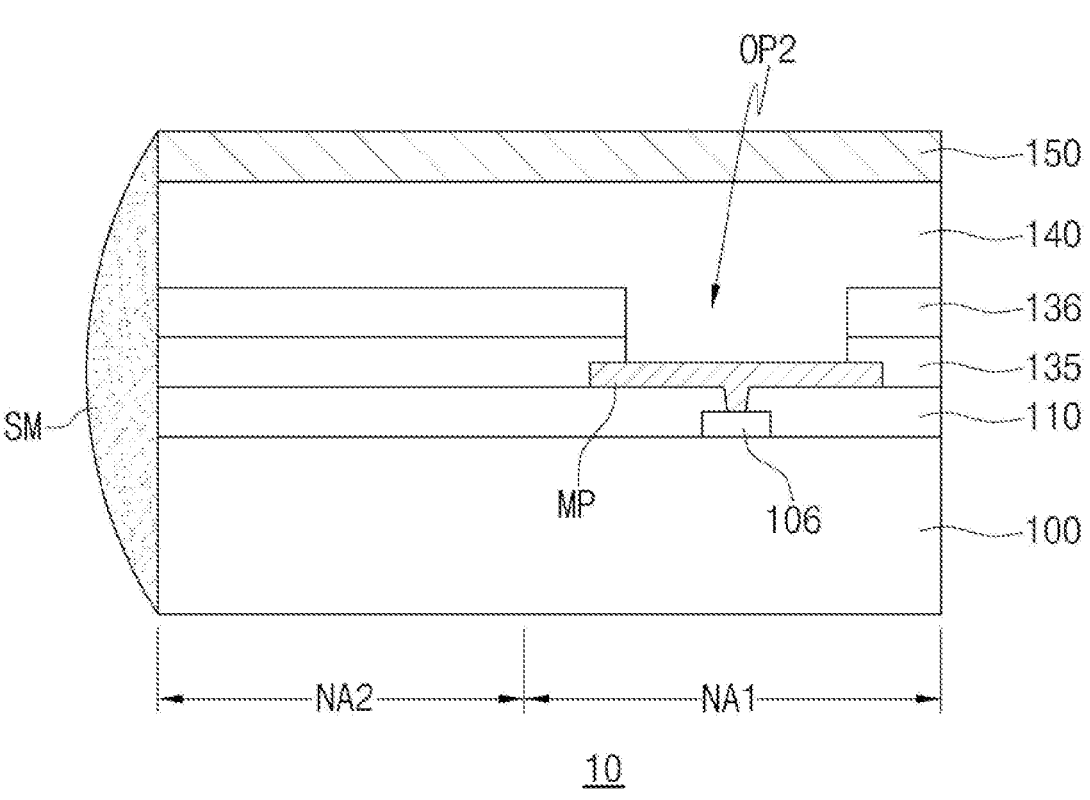
FIG. 5 is a cross-sectional view schematically showing an X-ray detector according to a third embodiment of the present disclosure.

FIG. 5 is a cross-sectional view schematically showing an X-ray detector according to a third embodiment of the present disclosure. In FIG. 5, for convenience of explanation, the cross-sectional structure in the non-display area NA is shown.

In this embodiment, detailed description of the same and similar configuration as the first and second embodiments described above may be omitted.

An X-ray detector 10 of the third embodiment may have the same and similar configuration as the X-ray detector of the first embodiment and the X-ray detector of the second embodiment described above. Regarding this, the X-ray detector 10 may have the contact pattern MP created in the first area NA1 of the non-display area NA, similar to the first embodiment. As another example, the X-ray detector 10 may have a plurality of contact patterns MP created in the first area NA1 of the non-display area NA, similar to the second embodiment.

Furthermore, in this embodiment, a sealing member SM may be provided on the outer surface of the X-ray detector 10. The sealing member SM may be provided on the entire or partial outer circumference of the X-ray detector 10, that is, at least a portion of the outer circumference.

The sealing member SM may be made of an adhesive material such as silicone or UV resin. The sealing member SM may be provided, for example, through a process of applying and curing the sealing member SM to the outer surface of the X-ray detector 10 using a dispenser.

The sealing member SM provided in this way may be formed over the outer surface of the substrate 100 and the outer surfaces of the stacked layers stacked on top of the substrate 100.

In this regard, in the X-ray detector 10 of this embodiment, the outer surfaces of the first and second interlayer insulating layers 110 and 135, the protective layer 136, the photoconductor layer 140, and the second electrode 150 may be formed to substantially match the outer surface of the substrate 100.

In this case, the sealing member SM may be formed over the outer surface of the substrate 100 and the outer surfaces of the first and second interlayer insulating layers 110 and 135, the protective layer 136, the photoconductor layer 140, and the second electrode 150.

Accordingly, by means of the sealing member SM, the photoconductor layer 140 may be attached to the substrate 100, so that the adhesion of the photoconductor layer 140 to the substrate 100 may be further increased.

Thus, the problem of the photoconductor layer 140 being detached (or peeled) from the substrate 100 may be alleviated. In addition, by forming the sealing member SM, it is possible to block foreign substances from entering the interior of the X-ray detector 10 through the side of the X-ray detector 10.

Fourth Embodiment

Figure 6:
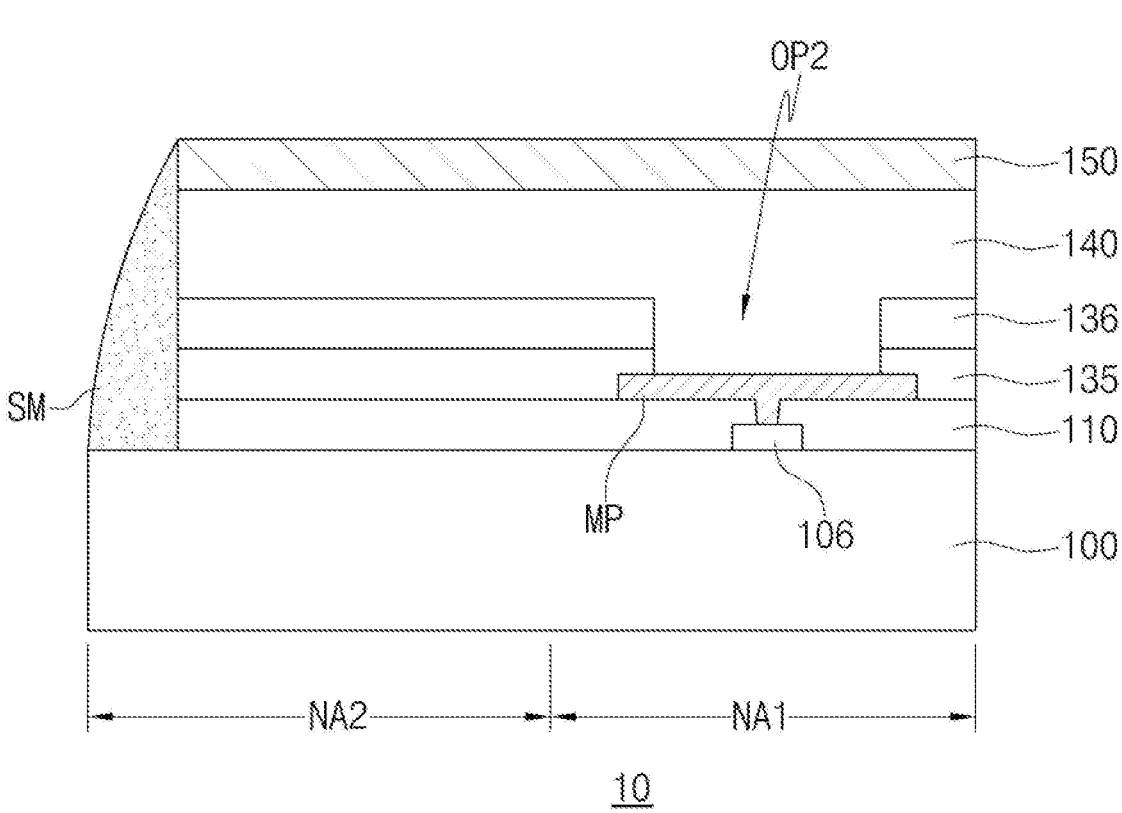
FIG. 6 is a cross-sectional view schematically showing an X-ray detector according to a fourth embodiment of the present disclosure.

FIG. 6 is a cross-sectional view schematically showing an X-ray detector according to a fourth embodiment of the present disclosure. In FIG. 6, for convenience of explanation, the cross-sectional structure in the non-display area NA is shown.

In this embodiment, detailed description of the same and similar configuration as the first, second, third embodiments described above may be omitted.

An X-ray detector 10 of the fourth embodiment may have the same and similar configuration as the X-ray detector of the first embodiment and the X-ray detector of the second embodiment described above. Regarding this, the X-ray detector 10 may have the contact pattern MP created in the first area NA1 of the non-display area NA, similar to the first embodiment. As another example, the X-ray detector 10 may have a plurality of contact patterns MP created in the first area NA1 of the non-display area NA, similar to the second embodiment.

Furthermore, in this embodiment, a sealing member SM is provided on the outer surface of the X-ray detector 10, but unlike the case of the third embodiment, the sealing member SM may be formed in contact with the outer surface of the photoconductor layer 140 on the end of the substrate 100.

Regarding this, in this embodiment, the outer surface of the photoconductor layer 140 may be formed to be located inward than the outer surface of the substrate 100. As an example, the outer surface of the photoconductor layer 140 may be positioned approximately 500 μm or more apart from the outer surface of the substrate 100.

In addition, the outer surfaces of the first and second interlayer insulating layers 110 and 135, and the protective layer 136 may be located inward than the outer surface of the substrate 100, similar to the case of the photoconductor layer 140. As another example, the outer surfaces of the first and second interlayer insulating layers 110 and 135, and the protective layer 136 may be formed to match the outer surface of the substrate 100.

The outer surface of the second electrode 150 may be located inward than the outer surface of the substrate 100, similar to the case of the photoconductor layer 140.

In this case, the sealing member SM may be applied to the space defined between the outer surface of the photoconductor layer 140 and the outer surface of the substrate 100 located further outside.

In other words, the sealing member SM may contact the upper surface of the end of the substrate 100, the upper surface of the upper end of the protective layer 136 above the upper surface of the end of the substrate 100, and may also contact the outer surface of the photoconductor layer 140.

Accordingly, by means of the sealing member SM, the photoconductor layer 140 may be attached to the substrate 100, so that the adhesion of the photoconductor layer 140 to the substrate 100 may be further increased.

Thus, the problem of the photoconductor layer 140 being detached (or peeled) from the substrate 100 may be further alleviated.

As described above, according to embodiments of the present disclosure, by forming at least one ring-shaped contact pattern in the non-display area, the photoconductor layer may contact with the metal or oxide not only in the display area but also in the non-display area.

Accordingly, it is possible to increase the contact area between the photoconductor layer on the substrate and the metal or oxide having excellent adhesion characteristics thereto. Therefore, the adhesion of the photoconductor layer to the substrate may be increased, thereby alleviating the problem of detachment (or peeling) of the photoconductor layer from the substrate.

Furthermore, the sealing member that contacts and seals the photoconductor layer and substrate may be formed on the side of the X-ray detector of the present disclosure. As a result, the adhesion of the photoconductor layer to the substrate may be further increased, making it possible to alleviate the problem of the photoconductor layer being detached (or peeled) from the substrate.

The above-described embodiment of the present disclosure is an example of the present disclosure, and free modification is possible within the scope included in the spirit of the present disclosure. Accordingly, the present disclosure includes modifications of the present disclosure within the scope of the appended claims and the equivalents thereof.

What is claimed is:

1. An X-ray detector comprising:

a substrate with a defined display area and a non-display area around the display area;

a first electrode provided in the display area on the substrate;

a photoconductor layer located on the first electrode and provided in the display area and the non-display area;

a second electrode provided on the photoconductor layer; and at least one contact pattern provided in the non-display area and configured to surround the display area, wherein the photoconductor layer is in contact with the at least one contact pattern located therebelow.

2. The X-ray detector of claim 1, further comprising:

an interlayer insulating layer provided on the first electrode and the at least one contact pattern, wherein the interlayer insulating layer comprises: a first opening where the photoconductor layer contacts the first electrode; and a second opening where the photoconductor layer contacts the at least one contact pattern.

3. The X-ray detector of claim 2, further comprising:

a protective layer provided on the interlayer insulating layer, wherein the interlayer insulating layer and the protective layer comprises: the first opening where the photoconductor layer contacts the first electrode; and the second opening where the photoconductor layer contacts the at least one contact pattern.

4. The X-ray detector of claim 1, wherein the at least one contact pattern and the first electrode are made of same metal or oxide.

5. The X-ray detector of claim 4, wherein the metal is titanium (Ti), tungsten (W), aluminum (Al), copper (Cu), chromium (Cr), gold (Au), or an alloy of any one of these, and the oxide is ITO (indium tin oxide), IZO (indium zinc oxide), or ZnO (zinc oxide).

6. The X-ray detector of claim 1, further comprising:

a sealing member configured to contact with an outer surface of the substrate and an outer surface of the photoconductor layer.

7. The X-ray detector of claim 6, wherein the outer surface of the substrate is located inward than the outer surface of the photoconductor layer, and the sealing member is located on an upper surface of an end of the substrate and contacts the outer surface of the photoconductor layer.

8. The X-ray detector of claim 1, wherein the photoconductor layer is made of perovskite.

* * * * *